United States Patent [19]

Iwahashi

[11] Patent Number: 5,175,705
[45] Date of Patent: Dec. 29, 1992

[54] SEMICONDUCTOR MEMORY DEVICE HAVING CIRCUIT FOR PREVENTION OF OVERCHARGE OF COLUMN LINE

[75] Inventor: Hiroshi Iwahashi, Yokohama, Japan

[73] Assignee: Kabushiki Kaisha Toshiba, Kawasaki, Japan

[21] Appl. No.: 542,084

[22] Filed: Jun. 22, 1990

[30] Foreign Application Priority Data

Jun. 27, 1989 [JP] Japan .................. 1-164970

[51] Int. Cl.⁵ .................. G11C 11/40; G11C 16/06
[52] U.S. Cl. .................. 365/204; 365/203; 365/189.09
[58] Field of Search .................. 365/185, 189.09, 203, 365/204, 207, 208, 210

[56] References Cited

U.S. PATENT DOCUMENTS

| | | | |
|---|---|---|---|
| 4,417,328 | 11/1983 | Ochii | 365/203 |
| 4,542,485 | 9/1985 | Iwahashi et al. | 365/189.09 |
| 4,694,429 | 9/1987 | Tanaka et al. | 365/185 |
| 4,769,784 | 9/1988 | Doluca et al. | 365/189.09 |
| 4,797,856 | 1/1989 | Lee et al. | 365/185 |

FOREIGN PATENT DOCUMENTS

| | | | |
|---|---|---|---|
| 0185094 | 10/1983 | Japan | 365/185 |
| 0077700 | 5/1984 | Japan | 365/185 |
| 0136996 | 7/1985 | Japan | 365/204 |

*Primary Examiner*—Glenn Gossage
*Attorney, Agent, or Firm*—Foley & Lardner

[57] ABSTRACT

A semiconductor memory device comprises row lines, memory cells selectively driven by the row lines, and a column line connected to the memory cells. A load transistor is connected to the column line. A source-/drain current path of a first transistor is connected between the column line and the load transistor. The gate potential of the first transistor is controlled by an output of an inverter. An input of the inverter is connected to the column line. A discharge circuit is also connected to the column line. When the potential on the column line is above a predetermined potential, the column line is discharged by the discharge circuit until the potential on the column line becomes equal to the predetermiend potential.

For the predetermined potential, a potential obtained by subtracting the threshold voltage of the first transistor from the gate voltage thereof, may be used. By employing the construction described above, there is provided a semiconductor memory device having a mechanism for the prevention of an overcharge operation of the column line.

31 Claims, 8 Drawing Sheets

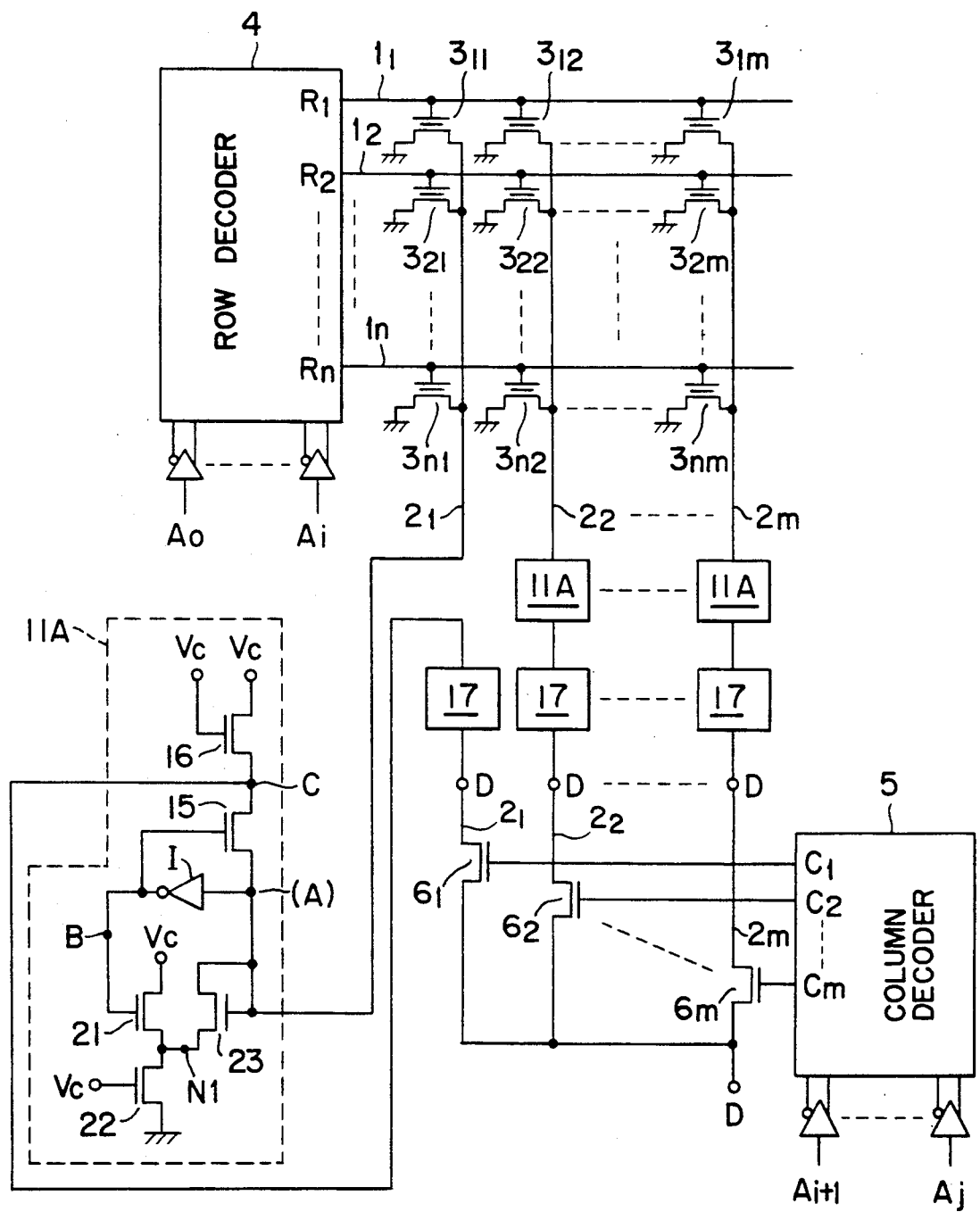
F I G. 10

SEMICONDUCTOR MEMORY DEVICE HAVING CIRCUIT FOR PREVENTION OF OVERCHARGE OF COLUMN LINE

FIELD OF THE INVENTION

This invention relates to a semiconductor memory device, and more particularly to a semiconductor memory device having a circuit for preventing column lines to which memory cells are connected from being overcharged.

BACKGROUND OF THE INVENTION

An electrically programmable read only memory (EEPROM) having a memory cell of a floating gate type, metal-oxide-semiconductor (MOS) transistor is described in the Japanese Patent Application Laid Open No. 60-136996. An example of such an EPROM is shown in FIG. 1. Namely, a plurality of row lines $1_1$ to $1_n$ and column lines $2_1$ to $2_m$ are arranged in lateral and longitudinal lines, respectively. On intersecting portions of the row lines and a column lines, memory cells $3_{11}$ to $3_{1m}$, $3_{21}$ to $3_{2m}$, ... each comprised of the floating gate type MOS transistor are arranged in a matrix form, respectively. More particularly, gates of groups of memory cells of the first to the n-th rows are connected to corresponding row lines $1_1$ to $1_n$, respectively. Similarly, drains of groups of memory cells of the first to the m-th columns are connected to corresponding column lines $2_1$ to $2_m$, respectively. Sources of all the memory cells are connected to the ground potential. One of the memory cells is designated by selecting one row line and one column line. One of the row lines and one of the column lines are selected by the row decoder 4 and column decoder 5, respectively. Only one of decoded signals $R_1$ to $R_n$ output by the row decoder 4 is a logic "1". A row line corresponding to the signal of "1" level is selected. One of decoded signals $C_1$ to $C_m$ output by the column decoder 5 is a logic "1". By the decode signals $C_1$ to $C_m$, one of enhancement type MOS transistors $6_1$ to $6_m$ connected in series with the column lines $2_1$ to $2_m$ is selected, i.e., is turned ON. Respective drains of transistors $6_1$ to $6_m$ are commonly connected to constitute a common connection node A. This node A is connected to a power supply $V_c$ of, e.g., 5 volts, through an enhancement type MOS transistor 12. The gate of the transistor 12 is connected to an output node B of an inverter I. This inverter I is comprised of a depletion type MOS transistor 13 and an enhancement type MOS transistor 14. The gate of the MOS transistor 14 serving as the input terminal of the inverter I is connected to the node A. The output terminal (node B) of the inverter I is further connected to the gate of an enhancement type MOS transistor 15 connected between the node A and a data sense node C. The data sense node C is connected to the power supply Vc through a load transistor 16. The gate of the load transistor 16 is also connected to the power supply Vc. A sense amplifier 17 is connected to the data sense node C. Data stored in the memory cell is detected by the sense amplifier 17.

In the semiconductor memory device thus constructed, it is now assumed that row line $1_1$ and column line $2_1$ are selected by the row and column decoders 4 and 5, respectively. So, the memory cell $3_{11}$ is selected. It is further assumed that the threshold voltage of the selected memory cell $3_{11}$ is low. No electron is injected into the floating gate of the memory cell $3_{11}$. In this case, Since this memory cell $3_{11}$ is turned ON, the column line $2_1$ is discharged through the memory cell $3_{11}$. Then, data D of "0" level is detected by the sense amplifier 17. In contrast, if it is now assumed that the threshold voltage of the memory cell $3_{11}$ is high, electrons are injected in the floating gate of the memory cell 311. In this case, if this cell is selected, it is not turned ON. For this reason, column line $2_1$ is charged through load transistors 12 and 16. Then, data of "1" level is detected by the sense amplifier 17.

However, the semiconductor memory device constructed as above has the drawback that the readout speed of "0" data is slow. This will be described in detail in relation to the operations of respective elements.

It is initially assumed that, e.g., a memory cell $3_{11}$ is selected by the row decoder 4 and the column decoder 5. Let suppose that this memory cell $3_{11}$ stores "0" data and is turned ON. Thus, the column line $2_1$ is discharged through the memory cell $3_{11}$, resulting in a low potential on the node A. As the result of the fact that potential on node A is lowered, a potential on node B of the output terminal of the inverter I rises. As the result of the fact that the potential on the node B rises, the resistance of the transistor 15 is lowered. For this reason, the potential on the node C becomes closer to the potential on the node A through the transistor 15. The sense amplifier 17 detects that the potential on the node C is lowered. That is, the sense amplifier 17 detects the "0" data stored in the memory cell $3_{11}$.

It is now assumed that a memory cell $3_{21}$ is selected. It is further assumed that this memory cell $3_{21}$ stores "1" data and is turned OFF even though if it is selected. The column line $2_1$ is charged through the transistors 12 and 16. At the beginning of the charging operation, the output of the inverter I is "1" level. For this reason, at the beginning of the charging operation, the column line $2_1$ is charged through the transistors 12 and 16. Thus, the potential on the node A is rapidly raised. The output potential of the inverter I is lowered in a direction of "0" level with the rising of the potential on the node A. Thus, the transistors 12 and 15 are turned OFF. As the result of the fact that the transistor 15 is turned OFF, the node C is charged through the transistor 16. The potential on the node C rises so that it is a logic "1". This "1" is detected by the sense amplifier 17.

The transistors 12 and 15 are turned OFF when the potential difference between the node A and the gates of the transistors 12 and 15 is less than the threshold voltages of the transistors 12 and 15.

However, in the inverter I, there is a delay time between the input and the output thereof. Consequently the potential of the node A would be a higher potential than a value obtained by subtracting the threshold voltage of the transistors 12 and 15 from the gate potentials of the transistors 12 and 15, when column line $2_1$ is charged.

The above-mentioned charging of the column line will be explained in more detail with reference to FIG. 3 in addition to FIG. 1. It is now assumed that the threshold voltages of the enhancement type transistors 12 and 15 are both represented by Vth. As previously described, in the case of the charging of node A, transistors 15 and 12 are turned OFF when the potential on node B is equal to sum of the potential on node A and the threshold voltage Vth. When transistors 15 and 12 are turned OFF, the result is no charge path in node A. As a result, there is no increase of potential more than the potential at that time. However, from a practical point of view, because of a delay in the operation of the inverter I, there occurs a delay in change of the potential of node B with respect to the change of the potential of node A. Generally, the potential on node B is lowered according to the rising of the potential on node A. Namely, when viewed from DC level, the potential on node B is determined relative to the potential on node A. However, as shown in FIG. 2, when the column line (the node A on the input side of the inverter I) is being charged in a manner of the AC charge operation, the potential on node B of the output of the inverter I varies in a delay time with respect to change of the potential on the node A. It is now assumed that, e.g., the potential on node A is equal to a value of X(V) at time $t_0$ and then changes to a value of $(X+\alpha)(V)$ at time $t_1$. The potential $Y_1(V)$ on node B at time $t_1$ is not determined by the potential on the node A at time $t_1$ without delay time. Because of the load capacitance existing on node B of the output of the inverter I and the response time of the transistor, the response speed of the inverter I is delayed. For this reason, the potential $Y_1$ on the node B at time $t_1$ corresponds to a potential which is viewed from the DC level with respect to the potential on the node A, e.g., at time $t_0$. For example, at time $t_1$ of FIG. 2, the potential on node B is equal to "the potential on node A plus Vth". However, the potential $Y_1$ on node B at the time $t_1$ is a potential which is viewed from the DC level with respect to the potential of X(V) on node A at the time $t_0$. For this reason, node A is over charged. Namely, it is now assumed that transistors 12 and 15 are turned OFF, so the charging of the node A is stopped. However, the potential of node B which is viewed from the DC level with respect to the potential $(X+\alpha)$ on the node A at the time $t_1$ appears at time $t_2$. For this reason, a potential relationship of the nodes A and B at the time $t_2$ and times subsequent thereto deviates from a relationship defining a critical and minimum DC potential required in order to allow the transistor 15 to be turned OFF. In the case of reading the data "0", even if the discharging of the node A is started, as long as the transistor 15 is not turned ON, the potential on node C is not lowered. For this reason, the sense amplifier cannot sense new data. If the charging of the column line is stopped in a manner that the relationship of the potentials of nodes A and B is in correspondence with that shown prior to $t_0$ in FIG. 2, transistor 15 is turned ON by a slight discharging of the node A, so that a potential on the node C is rapidly discharged. However, when the relationship between the potential of the node B and the potential of the node A changes to the relationship as shown at time $t_2$ of FIG. 2, the memory cell must discharge a large quantity of charges in the column line in order to turn on the transistor 15. Furthermore, a large capacitance exists on the column line. For this reason, a greater quantity of charges must be discharged in order to turn on transistor 15. Therefore, the discharging time is prolonged. For these reasons, particularly when it is necessary to discharge charges on the column line, there results the drawback that the data readout speed becomes slow. For this reason, in the prior art, in order to provide a high speed response of the inverter I, the current drivability of the inverter I was enhanced. However, when an approach to enhance the current drivability is employed, there is a new drawback in that the power dissipation in the inverter I is increased.

SUMMARY OF THE INVENTION

This invention has been made in view of the above and its object is to provide a semiconductor memory device capable of improving a read speed while suppressing an increase in power dissipation.

Column lines are adapted so that they are charged through a load transistor and a first transistor. The potential on the source of the first transistor, i.e., on the column line is prevented from being in an overcharged state where that potential is higher than a critical potential obtained by subtracting the threshold voltage of the first transistor from the gate voltage thereof. Namely, when the column line is charged in an overcharged state, the column line is discharged toward the critical potential. As a result, the column line potential is lowered to the critical potential and is thus stabilized at that critical potential. In addition, there is no increase in the dissipation current. In accordance with this invention, the potential on a column line used for reading data from a selected memory cell is stabilized at a predetermined potential, e.g., at a critical potential obtained by subtracting the threshold voltage of the first transistor from the gate potential thereof, thus making it possible to prevent the overcharge. Even in the case where the subsequent read operation requires discharge of the column line, that read operation can be rapidly carried out.

BRIEF DESCRIPTION OF THE DRAWINGS

FIG. 10 is a circuit diagram showing an embodiment in which discharge circuits are provided to every column line;

DESCRIPTION OF THE PREFERRED EMBODIMENTS

Figure 3:
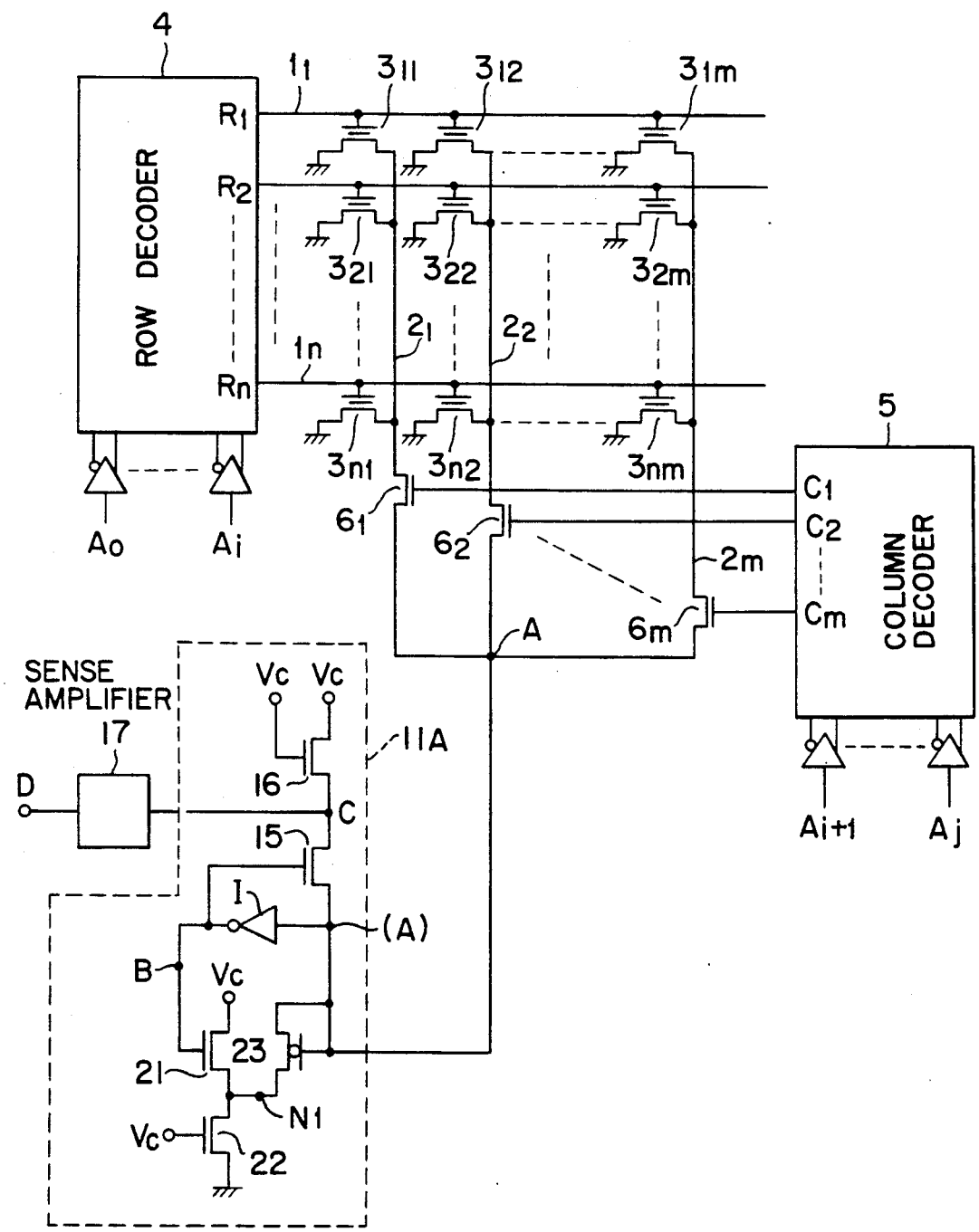
FIG. 3 is a circuit diagram showing the entirety of a semiconductor memory device to which a first embodiment of this invention is applied.
Figure 4:
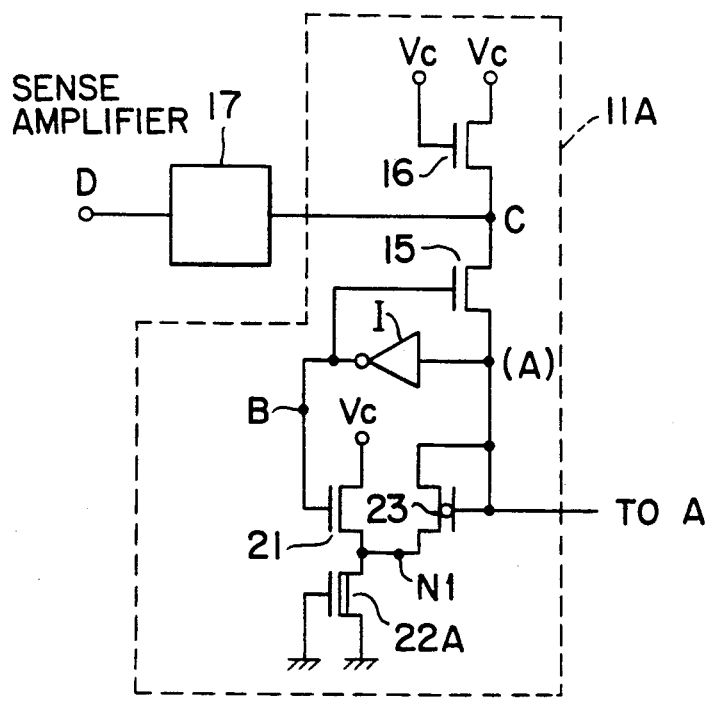
FIGS. 4 to 9 are circuit diagrams showing other embodiments different from each other of the circuit 11A shown in FIG. 3.
Figure 5:
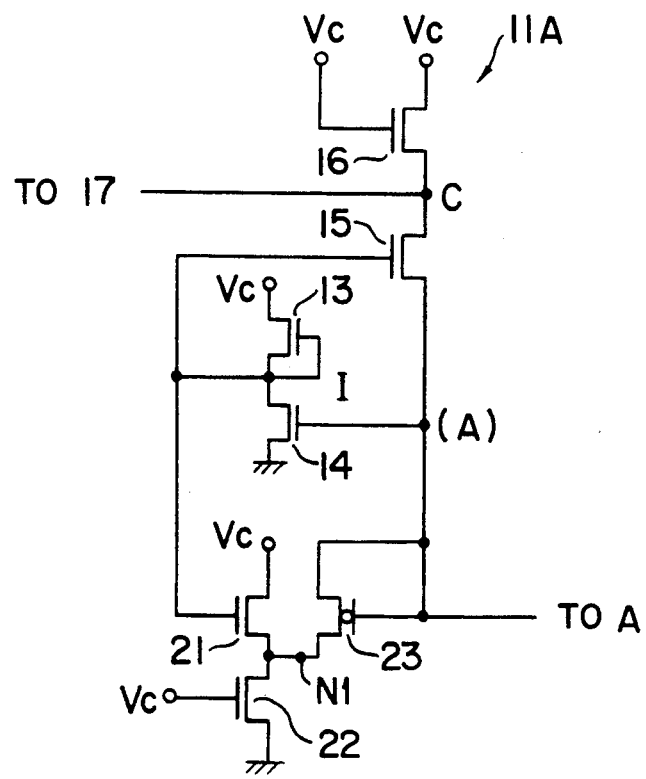
Figure 6:
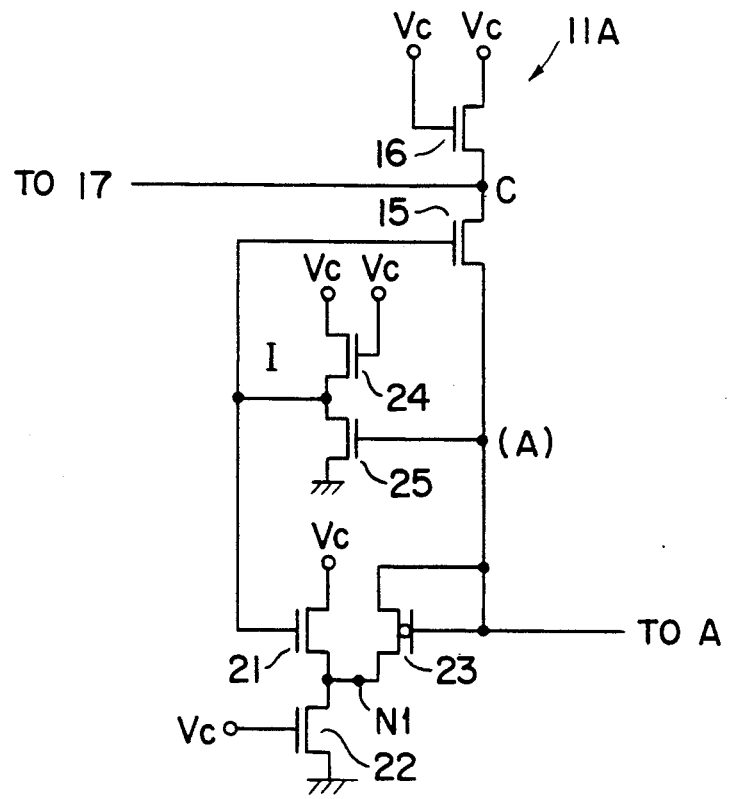
Figure 7:
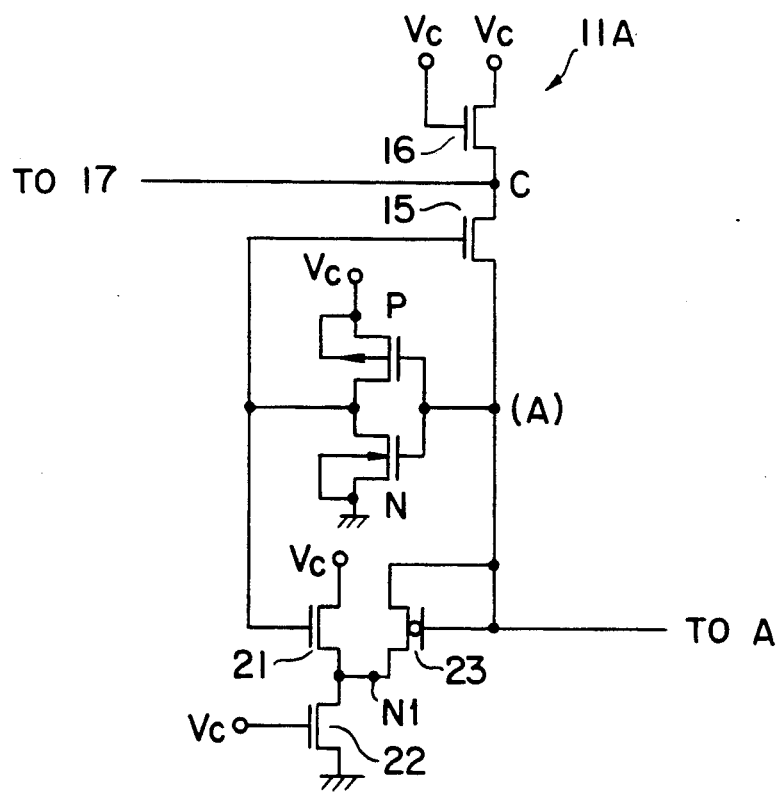

Initially, referring to FIG. 3, there is shown an embodiment of this invention. In this figure, the same reference numerals are attached to components identical to those in FIG. 1. The embodiment of FIG. 3 differs from the embodiment of FIG. 1 in that a circuit 11A is used in place of the circuit 11 of FIG. 1. This circuit is constructed as follows. Namely, the circuit 11A comprises a load transistor 16 of which a drain and gate are connected to the power supply Vc. The source of this transistor 16 is connected to sense amplifier 17 and the drain of a (first transistor) 15. A common junction node A of the column lines is connected to the source of transistor 15. The source (node A) of transistor 15 is connected to the drain and the gate of a second transistor 23 having a threshold voltage of substantially zero volts. The source (node N1) of the transistor 23 is connected to the junction of third and fourth 21 and 22 connected in series between the power supply Vc and ground. The current drivability of the transistor 22 is sufficiently smaller than that of the transistor 21. As shown in FIG. 4, a transistor of the depletion type 22A may be used. In this case, it is desirable that the gate of the transistor 22A is connected to ground potential. The power supply Vc is connected to the gate of the transistor 22. The gate of the transistor 21 is connected to the gate of the transistor 15. An inverter I is connected between the source and the gate of the transistor 15. As the inverter I, for example, an inverter like the inverter shown in FIG. 1 may be used (FIG. 5), or an inverter comprised of transistors 24 and 25 shown in FIG. 11 may be used (FIG. 6). Alternatively, a CMOS inverter comprised of a P-channel transistor and an N-channel transistor may be used (FIG. 7).

The potential on node N1 is determined by transistor 21. Namely, the potential on the node N1 is determined as a value obtained by subtracting the threshold voltage of the transistor 21 from the potential on the node B. Furthermore, the threshold voltage of transistor 23 is approximately zero volts. Accordingly, when the potential on node N1, determined by the transistor 21, is lower than the potential on the node A, the transistor 23 is turned ON. Since the transistor 23 is turned ON, the potential on the node A is discharged through the transistor 23. Thus, even if the node A is overcharged, the potential of the node A is changed to equal to the potential of the node $N_1$.

The operation of circuit 11A will be described in more detail. It is now assumed that the potential on node B, the potential on node A, and the potential on node N1 are represented by $V_B$, $V_A$ and $V_{N1}$, respectively. It is further assumed that the threshold voltages of transistors 15 and 21 are represented by $V_{th15}$ and $V_{th21}$, respectively. Classifying the operation by the relationship between $V_{N1}$ and $V_A$ to consider respective cases of $V_{N1} > V_A$ and $V_{N1} < V_A$.

(1) Case Of $V_{N1} > V_A$

The relationship expressed as $V_B - V_{th21} = V_{N1}$ holds. Accordingly, when $V_{th15}$ is assumed to be equal to $V_{th21}$, the relationship expressed as $V_B - V_{th15} = V_{N1}$ holds. Since $V_{N1} > V_A$, the relationship expressed as $V_B - V_{th15} > V_A$ results. This indicates that node A is in a discharged state.

(2) Case of $V_{N1} < V_A$

As previously described, since the relationship expressed as $V_B - V_{th15} = V_{N1}$ holds, the relationship expressed as $V_B - V_{th15} < V_A$ results. This indicates that the node A is an overcharged state. However, the potential $V_A$ on the node A is discharged through the transistor 23 until $V_A$ becomes equal to $V_{N1}$, and is eventually fixed in that state. Namely, the relationship expressed as $V_B - V_{th15} = V_A$ results. In other words, the potential difference between $V_A$ and $V_B$ becomes equal to $V_{th15}$. This implies that the potential difference has become equal to the above-described ideal value.

Figure 1:
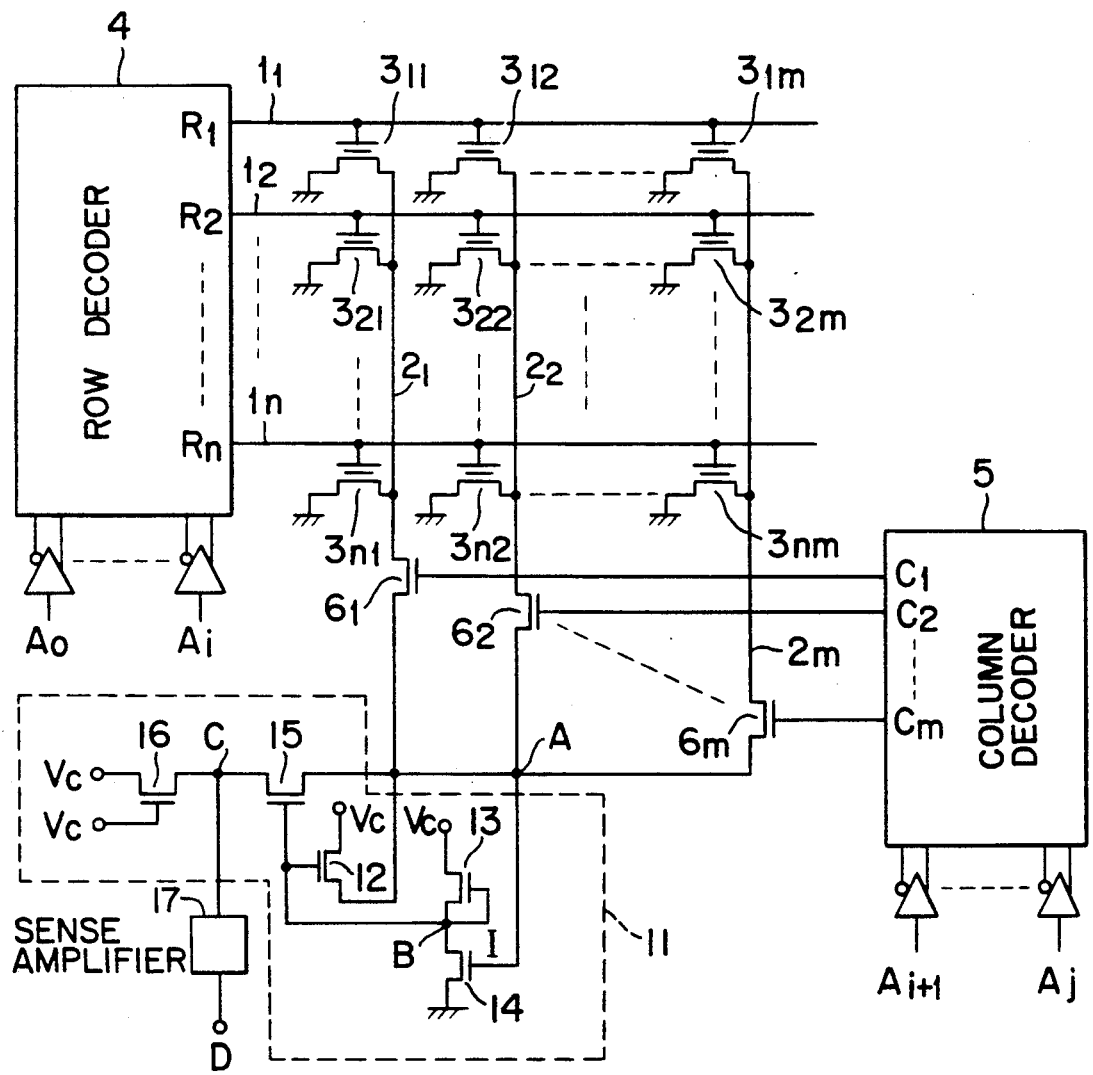
FIG. 1 is a circuit diagram showing the entirety of a conventional semiconductor memory device.
Figure 2:
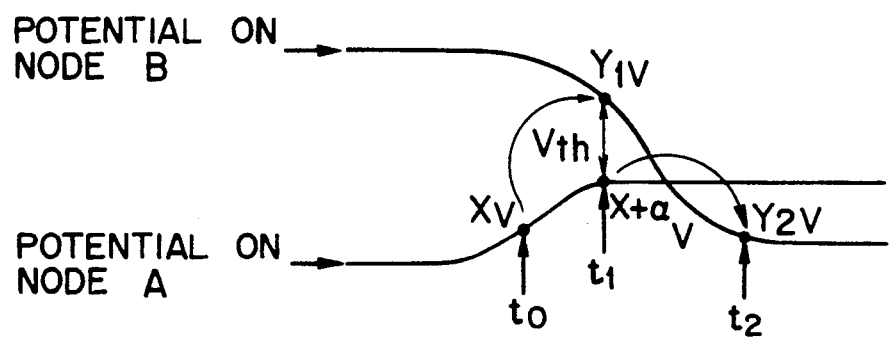
FIG. 2 is a diagram for explaining the operation of the conventional semiconductor device of FIG. 1, respectively.
Figure 8:
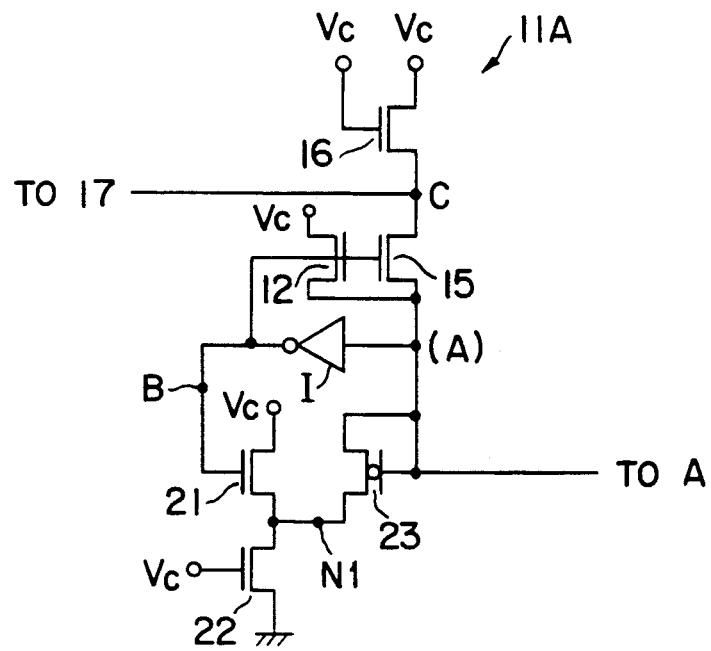

While the transistor 12 in the circuit 11 of FIG. 1 is omitted in the circuit of FIG. 3, a transistor corresponding to the transistor 12 may be used also in the circuit 11 of FIG. 3 (FIG. 8).

Figure 11:
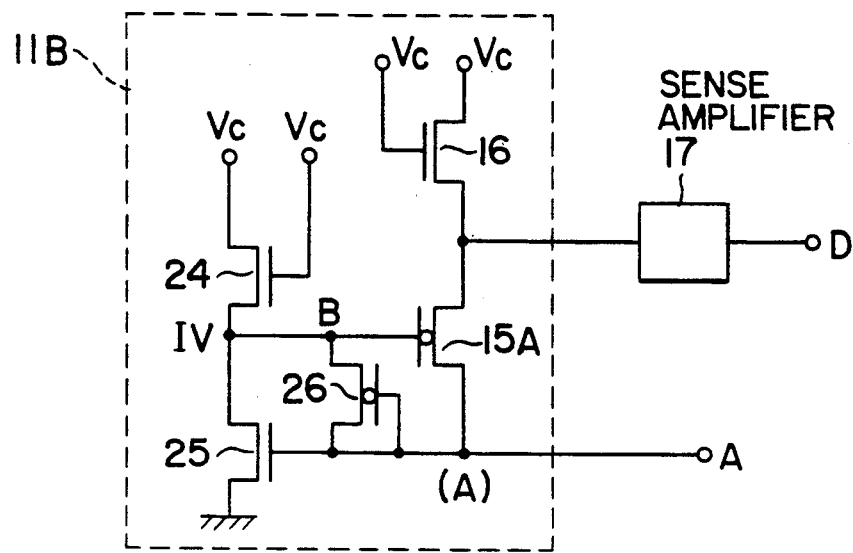
FIG. 11 is a circuit diagram showing a second embodiment of this invention.

FIG. 11 shows a modified circuit embodiment used in place of the circuit 11A of FIG. 3. In the circuit 11B of FIG. 11, a transistor 15A is used in place of the transistor 15 of FIG. 3. The circuit 11B comprises a load transistor 16 of which the drain and the gate are connected to the power supply Vc. The source of transistor 16 is connected to the node A through the drain and source of transistor (first transistor) 15A having a threshold voltage of approximately zero volts. On the other hand, transistors 24 and 25 are connected in series between the power supply Vc and ground. These transistors 24 and 25 constitute an inverter IV. The power supply Vc is connected to the gate of transistor 24. The gate (input terminal) of transistor 25 is connected to node A (the source of the transistor 15A). The junction of transistors 24 and 25, i.e., the output terminal of the inverter IV is connected to the gate of the transistor 15A. A second transistor 26 having a threshold voltage of approximately zero volts is connected between node A and the gate of transistor 15A. The gate of the transistor 26 is connected to the node A.

Also in a circuit 11B thus constructed overcharging of node A is prevented. When the potential of node $A(V_A)$ is higher than the potential of node $B(V_B)$, transistor 26 is turned ON. As a result, charges on node A are discharged to node B. This discharging is stopped, when the potential of node A is equal to the potential of node B. Namely, even if node A is overcharged into the state of $V_A > V_B$, the potential on the node A is lowered and is eventually fixed in an ideal state of $V_A = V_B$.

Figure 12:
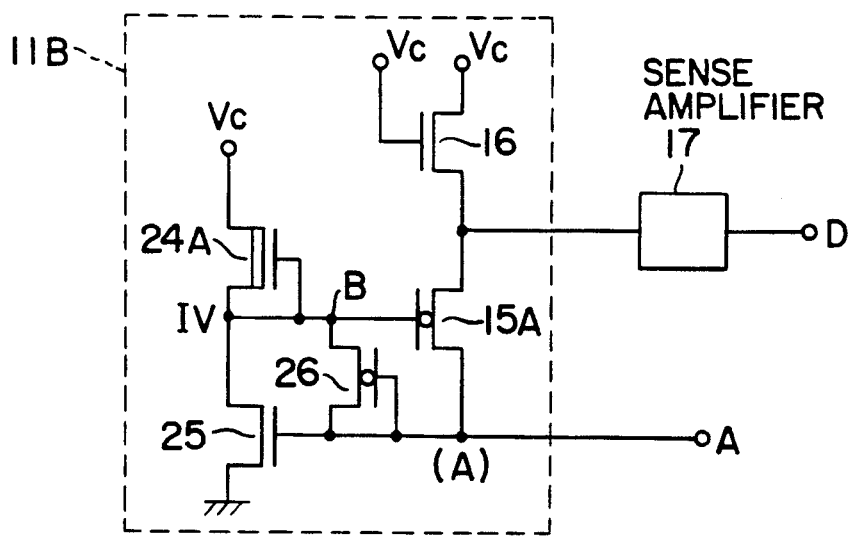
FIG. 12 is a circuit diagram showing a modified example of the circuit 11B shown in FIG. 11.

Instead of transistor 24, an inverter may be formed by using a depletion type transistor 24A of which gate and source are connected to the junction B as shown in FIG. 12.

As described above, in accordance with the embodiment of this invention, even if the node A is temporarily overcharged, a discharge path is provided at node A, thus making it possible to discharge the potential on node A until it becomes equal to the critical potential. In addition, discharging of the node A can be rapidly carried out without increasing a power dissipation. It is to be noted that it is not necessarily required that the transistors 23 and 26 have a threshold voltage of exactly zero volts, but may have a value slightly shifted in a positive or negative direction with respect to zero volts. Even in that case, since the potential on the column line can be kept at a potential closer to the above-mentioned critical potential, the read speed can be faster than that in the prior art.

Figure 9:
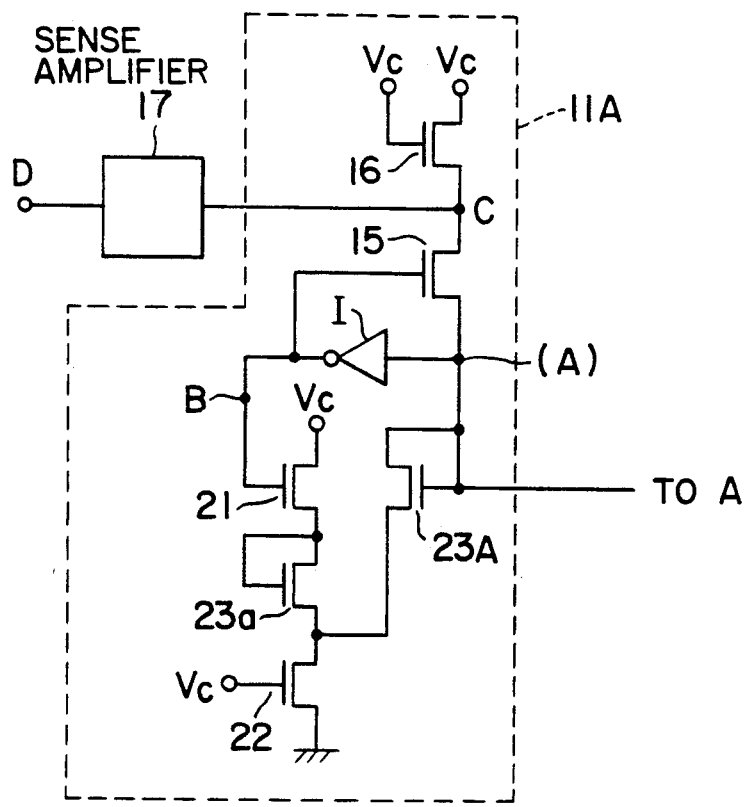

While the second transistor 23 having a threshold voltage of substantially zero volts is used in FIG. 3, a second transistor 23A having a threshold voltage which is not equal to zero volts may be used as shown in FIG. 9. In this case, a sixth transistor 23a is connected between a fifth transistor 21 and a seventh transistor 22. The threshold voltage of transistor 23a is the same value as that of transistor 23A.

While one circuit 11A for discharge operation is connected to the common junction node A of column lines in FIG. 3, circuits 11A may be connected to every column line as shown in FIG. 10, respectively.

Reference signs in the claims are intended for better understanding and shall not limit the scope.

What is claimed is:

1. A semiconductor memory device having a circuit for prevention of an overcharge operation of a column line, comprising:
   row lines;
   memory cells selectively driven by said row lines;
   a column line connected to said memory cells;
   a first transistor (15; 15A) having a drain-source current path and a gate, one end of said drain-source current path of said first transistor (15; 15A) being connected to said column line, a potential on the gate of said first transistor (15; 15A) being controlled in response to a potential on said column line;

a load transistor (16) having a drain-source current path connected between the other end of said drain-source current path of said first transistor and a power supply terminal; and discharge means, connected to said column line, for discharging said column line, said discharge means being operative to discharge said column line to a predetermined critical potential when the potential on said column line is higher than said predetermined critical potential.

2. A device as set forth in claim 1, wherein each of said memory cells comprises an electrically programmable metal-oxide semiconductor (MOS) transistor having a floating gate.

3. A device as set forth in claim 1, wherein said predetermined critical potential is a value equal to a gate potential of said first transistor (15, 15A) minus a threshold voltage of said first transistor.

4. A device as set forth in claim 1, wherein said discharge means includes inverting means, said inverting means having an input and an output, the input of said inverting means being connected to said column line, the output of said inverting means being connected to the gate of said first transistor (15; 15A), for controlling the potential on the gate of said first transistor (15; 15A) in response to the potential on said column line.

5. A device as set forth in claim 4, wherein said inverting means is a complementary metal-oxide semiconductor (CMOS) inverter comprising a P-channel transistor and an N-channel transistor.

6. A device as set forth in claim 4, further comprising an additional transistor (12), said additional transistor having a drain-source current path and a gate, said drain-source current path of said additional transistor being connected between a power supply terminal and said column line, the gate of said additional transistor (12) being connected to the gate of said first transistor (15).

7. A device as set forth in claim 1, wherein said discharge means includes a second transistor (23; 23A; 26), conduction of said second transistor (23; 23A; 26) being controlled in response to the potential on said column line, said column line being discharged through said second transistor (23; 23A; 26) to said predetermined critical potential when the potential on said column line is higher than said predetermined critical potential.

8. A device as set forth in claim 7, wherein said predetermined critical potential is a value equal to a potential on the gate of said first transistor (15, 15A) minus a threshold voltage of said first transistor.

9. A device as set forth in claim 7, wherein each of said memory cells comprises an electrically programmable MOS transistor having a floating gate.

10. A device as set forth in claim 7, wherein said second transistor (23; 23A; 26) has a drain-source current path, said drain-source current path of said second transistor (23; 23A; 26) being connected between said column line and a circuit node, a potential on said circuit node varying in response to the potential on said column line, said column line being discharged through said current path of said second transistor (23; 23A; 26) to said predetermined critical potential when the potential on said column line is higher than said predetermined critical potential.

11. A device as set forth in claim 10, wherein said predetermined critical potential is a value equal to a potential on the gate of said first transistor (15, 15A) minus a threshold voltage of said first transistor.

12. A device as set forth in claim 10, wherein each of said memory cells comprises an electrically programmable MOS transistor having a floating gate.

13. A device as set forth in claim 10, wherein when the potential on said column line rises, the potential on said circuit node falls, while when the potential on said column lines falls, the potential on said circuit node rises.

14. A device as set forth in claim 13, wherein each of said memory cells comprises an electrically programmable MOS transistor having a floating gate.

15. A device as set forth in claim 13, wherein said predetermined critical potential is a value equal to a potential on the gate of said first transistor (15, 15A) minus a threshold voltage of said first transistor.

16. A device as set forth in claim 13, wherein the gate of said first transistor (15A) is connected to said circuit node, said circuit node controlling the potential on the gate of said first transistor in response to the potential on said column line.

17. A device as set forth in claim 16, wherein threshold voltages of said first and second transistors (15A, 26) are equal to substantially zero volts.

18. A device as set forth in claim 16, wherein each of said memory cells comprises an electrically programmable MOS transistor having a floating gate.

19. A device as set forth in claim 16, wherein said predetermined critical potential is a value equal to a potential on the gate of said first transistor (15, 15A) minus a threshold voltage of said first transistor.

20. A device as set forth in claim 13, wherein said discharge means further includes a third transistor (21) and a fourth transistor (22; 22A) connected in series between said power supply terminal and ground, wherein said circuit node is a junction of said third and fourth transistors, and wherein a gate potential of said third transistor (21) is controlled in response to the potential on said column line, whereby when the potential on said column line rises, the potential on said circuit node falls, while when the potential on column line falls, the potential on said circuit node rises.

21. A device as set forth in claim 20, wherein a threshold voltage of said third transistor (21) is equal to a threshold voltage of said first transistor (15).

22. A device as set forth in claim 20, wherein a threshold voltage of said second transistor (23) is approximately zero volts.

23. A device as set forth in claim 20, wherein said fourth transistor (22A) is a depletion type transistor having a gate connected to the source thereof.

24. A device as set forth in claim 20, wherein said third transistor (21) has a gate, the gate of said third transistor (21) being connected to the gate of said first transistor (15).

25. A device as set forth in claim 20, wherein each of said memory cells comprises an electrically programmable MOS transistor having a floating gate.

26. A device as set forth in claim 20, wherein said predetermined critical potential is a value equal to a potential on the gate of said first transistor (15, 15A) minus a threshold voltage of said first transistor.

27. A device as set forth in claim 20, wherein said discharge means further comprises potential drop means connected in series with said third and fourth transistors, said potential drop means being connected between said circuit node and one end of a drain-source current path of said third transistor.

28. A device as set forth in claim 27, wherein each of said memory cells comprises an electrically programmable MOS transistor having a floating gate.

29. A device as set forth in claim 27, wherein said predetermined critical potential is a value equal to a potential on the gate of said first transistor (15, 15A) minus a threshold voltage of said first transistor.

30. A semiconductor memory device having a circuit for prevention of an overcharge operation of a column line, comprising:

a plurality of row lines;
a plurality of memory cells selectively driven by said row lines;
a plurality of column lines connected to said memory cells;
column select means (61 to 6m) for selecting one of said column lines;
a first transistor (16; 15A) having a drain-source current path and a gate, one end of said drain-source current path of said first transistor (15; 15A) being coupled to a selected column line, a potential on the gate of said first transistor (15; 15A) being controlled in response to a potential on said selected column line;
a load transistor (16) having a drain-source current path connected between the other end of said drain-source current path of said first transistor (15; 15A) and a power supply terminal; and
discharge means, coupled to said selected column line, for discharging said selected column line, said discharge means being operative to discharge said selected column line to a predetermined critical potential when the potential on said selected column line is higher than said predetermined critical potential.

31. A semiconductor memory device having a circuit for prevention of an overcharge operation of a column line, comprising:

a plurality of row lines;
a plurality of memory cells selectively driven by said row lines;
a plurality of column lines connected to said memory cells;
column select means (61 to 6m) for selecting one of said column lines;
a first transistor (15; 15A) having a drain-source current path and a gate, one end of said drain-source current path of said first transistor (15; 15A) being coupled to a selected column line, a potential on the gate of said first transistor (15; 15A) being controlled in response to a potential on said selected column line;
a load transistor (16) having a drain-source current path connected between the other end of said drain-source current path of said first transistor (15; 15A) and a power supply terminal; and
a plurality of discharge means for discharging said selected column line, each of said discharge means being coupled to a corresponding one of the column lines and being operative to discharge the corresponding one of the column lines to a predetermined critical potential when the potential on said selected column line is higher than said predetermined critical potential.

* * * * *